(12) United States Patent
Canning et al.

(10) Patent No.: US 10,003,311 B1
(45) Date of Patent: Jun. 19, 2018

(54) COMPACT CLASS-F CHIP AND WIRE MATCHING TOPOLOGY

(71) Applicant: Infineon Technologies AG, Neubiberg (DE)

(72) Inventors: Timothy Canning, Morgan Hill, CA (US); Richard Wilson, Morgan Hill, CA (US); Haedong Jang, San Jose, CA (US); David Seebacher, Villach (AT); Christian Schuberth, Villach Landskron (AT); Rongguo Zhou, Gilroy, CA (US); Bayaner Arigong, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/386,039

(22) Filed: Dec. 21, 2016

(51) Int. Cl.
| | |
|---|---|
| *H03H 7/38* | (2006.01) |
| *H03F 1/56* | (2006.01) |
| *H03F 3/195* | (2006.01) |
| *H03F 3/213* | (2006.01) |
| *H01L 23/66* | (2006.01) |

(52) U.S. Cl.
CPC ............ *H03F 1/565* (2013.01); *H01L 23/66* (2013.01); *H03F 3/195* (2013.01); *H03F 3/213* (2013.01); *H03H 7/38* (2013.01); *H01L 2223/6611* (2013.01); *H01L 2223/6655* (2013.01); *H03F 2200/111* (2013.01); *H03F 2200/222* (2013.01); *H03F 2200/387* (2013.01); *H03F 2200/451* (2013.01)

(58) Field of Classification Search
CPC ...... H03F 1/56; H03F 1/565; H03F 2200/222; H03F 2200/387; H03F 2200/451; H01L 23/64; H01L 23/66; H01L 2223/6655; H03H 7/38

USPC ............................ 333/32; 330/302, 305, 306
See application file for complete search history.

(56) References Cited

U.S. PATENT DOCUMENTS

| | | |
|---|---|---|
| 7,598,827 B2 | 10/2009 | Stuebing et al. |
| 8,717,102 B2 | 5/2014 | Wilson et al. |
| 2015/0365057 A1* | 12/2015 | Kaczman ................ H03F 1/565 |

OTHER PUBLICATIONS

Beltran, Ramon ., "Class-F and Inverse Class-F Power Amplifier Loading Networks Design Based upon Transmission Zeros", Microwave Symposium (IMS), 2014 IEEE MTT-S International, Jun. 1-6, 2014, Jul. 10, 2014, pp. 1-4.

(Continued)

*Primary Examiner* — Stephen E Jones
(74) *Attorney, Agent, or Firm* — Murphy, Bilak & Homiller, PLLC

(57) ABSTRACT

An amplifier circuit includes an RF input port, an RF output port, a reference potential port, and an RF amplifier having an input terminal and a first output terminal. An output impedance matching network electrically couples the first output terminal to the RF output port. A first inductor is electrically connected in series between the first output terminal and the RF output port, a first LC resonator is directly electrically connected between the first output terminal and the reference potential port, and a second LC resonator is directly electrically connected between the first output terminal and the reference potential port. The first LC resonator is configured to compensate for an output capacitance of the RF amplifier at a center frequency of the RF signal. The second LC resonator is configured to compensate for a second order harmonic of the RF signal.

20 Claims, 4 Drawing Sheets

(56) References Cited

OTHER PUBLICATIONS

Goel, Saurabh et al., "LC Network for a Power Amplifier with Selectable Impedance", U.S. Appl. No. 15/078,298, filed Mar. 23, 2016, pp. 1-32.
Jang, Haedong et al., "Compact Chireix Combiner and Impedance Matching Circuit", U.S. Appl. No. 15/185,786, filed Jun. 17, 2016, pp. 1-31.
Junming, Lim et al., "Design of broadband class-F power amplifier with high-order harmonic supression for S-band applicaiton", Chinese Institute of Electronics, Journal fo Semiconductors, 2015, vol. 36, No. 12, Dec. 2015, pp. 1-5.
Marbell, Marvin et al., "RF Device Package with Integrated Hybrid Coupler", U.S. Appl. No. 14/966,474, filed Dec. 11, 2015, pp. 1-36.
Rassokhina, Yu V. et al., "Inverse Class-F Power Amplifier Using Slot Resonators as a Harmonic Filter", International Journal of Microwave and Optical Technology, vol. 9, No. 1, Jan. 2014, pp. 49-53.
Van Der Heijden, Mark P. et al., "On the Design of Unilateral Dual-Loop Feedback Low-Noise Amplifiers with Simultaneous Noise, Impedance, and IIP3 Match", IEEE Journal of Solid-State Circuits, vol. 39, No. 10, Oct. 2004, pp. 1727-1736.

\* cited by examiner

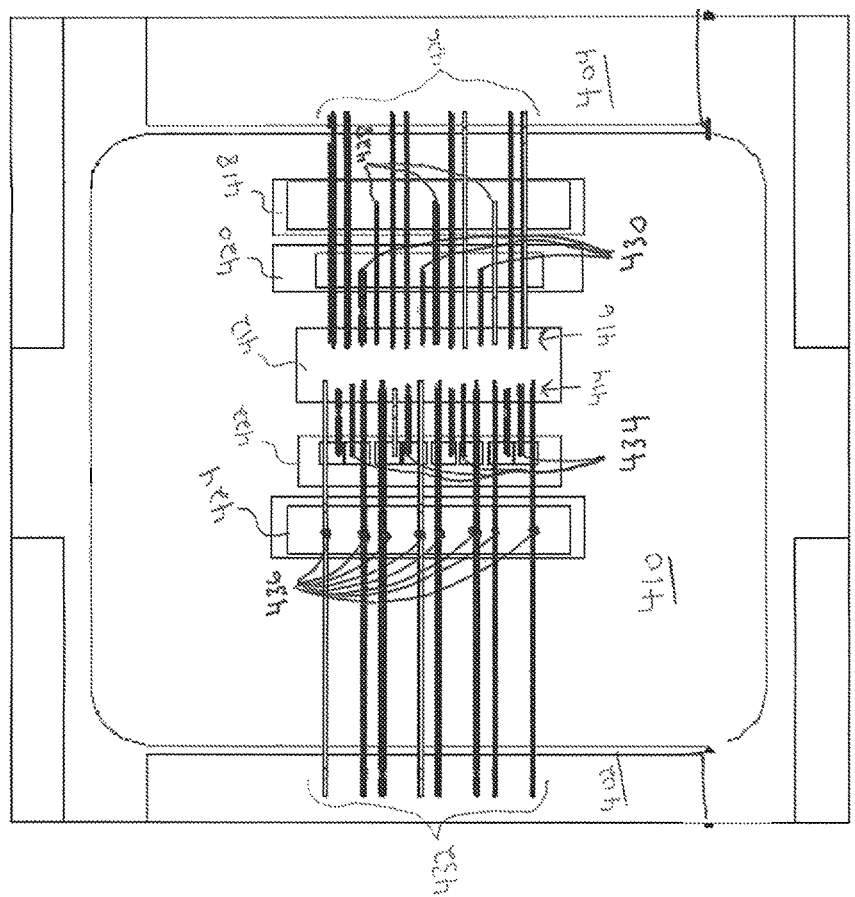

COMPACT CLASS-F CHIP AND WIRE MATCHING TOPOLOGY

FIELD OF TECHNOLOGY

The present application relates to RF (radio frequency) amplifiers, in particular, impedance matching networks for RF amplifiers.

BACKGROUND

RF power amplifiers are used in a variety of applications such as base stations for wireless communication systems, etc. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher.

RF power amplifiers are designed to provide linear operation without distortion. Input and output impedance matching circuits are used to match RF transistors that may have low input and output impedances (e.g., around 1 ohm or less for high power devices), to the impedance matching networks of an external device, such as a circuit board.

Class F amplifier configurations are gaining increased favor due to their highly efficient operation in modern RF applications. Class F amplifier design requires careful tuning of higher order harmonics. Power efficiency can be improved by incorporating harmonic tuning circuits in impedance matching circuit topology. One way to provide these harmonic tuning circuit is to etch patterns into an RF specific, low loss PCB (printed circuit board). The distributed nature of these matching networks and the high quality of the metallization and dielectric produces a highly efficient configuration. Unfortunately, these networks are also physically large, and the exact size of the elements depends on the dielectric constant of the PCB, the thickness of the PCB, and is inversely related to the frequency of operation. Other impedance matching techniques utilize a mix of high dielectric constant materials to implement the harmonic terminations in a space efficient manner and a lower dielectric constant material for the rest of the matching network. These implementations tend to be expensive and difficult to manufacture due to thermal mechanical concerns. Another impedance matching technique occurs at the package level and involves using bonding wires and chip capacitors to form the lumped elements that provide harmonic tuning. These configurations tend to exhibit high loss at both DC and RF, but can be made extremely compact, due to their "lumped" nature. The DC resistance of the series bond wires between the package and the die are not negligible, especially in high-power GaN applications in which the power densities can be extremely high and the number of bond wires that can fit on a pad are limited.

SUMMARY

An amplifier circuit is disclosed. According to an embodiment, the amplifier circuit includes an RF input port, an RF output port, a reference potential port, and an RF amplifier having an input terminal and a first output terminal. The RF amplifier is configured to amplify an RF signal across an RF frequency range. The amplifier circuit further includes an output impedance matching network electrically coupling the first output terminal to the RF output port. The output impedance matching network includes a first inductor electrically connected in series between the first output terminal and the RF output port, a first LC resonator directly electrically connected between the first output terminal and the reference potential port, and a second LC resonator directly electrically connected between the first output terminal and the reference potential port and being in parallel with the first LC resonator. The first LC resonator is configured to compensate for an output capacitance of the RF amplifier at a center frequency of the RF signal. The second LC resonator is configured to compensate for a second order harmonic of the RF signal.

According to another embodiment, the amplifier circuit includes an RF input port, an RF output port, a reference potential port, an RF amplifier having an input terminal and a first output terminal. The RF amplifier is configured to amplify an RF signal across an RF frequency range. The amplifier circuit further includes an input impedance matching network electrically coupling the RF input port to the input terminal. The input impedance matching network includes a fourth inductor electrically connected in series between the RF input port and the first input terminal, a third LC resonator directly electrically connected between the first input terminal and the reference potential port, and a fourth LC resonator directly electrically connected between the first input terminal and the reference potential port and being in parallel with the third LC resonator. The third LC resonator is configured to compensate for an input capacitance of the RF amplifier at a center frequency of the RF signal. The fourth LC resonator is configured to compensate for a second order harmonic of the RF signal.

A packaged amplifier circuit is disclosed. According to an embodiment, the packaged amplifier circuit includes an RF input lead, an RF output lead, a metal substrate with an electrically conductive source pad, the source pad being connected to a reference potential lead, and an RF transistor. The RF transistor has gate, source and drain terminals. The RF transistor is configured to amplify an RF signal across an RF frequency range. The RF transistor is mounted on the substrate with the source terminal directly facing and electrically connected to the source pad. The packaged amplifier circuit further includes an input impedance matching network electrically coupling the RF input lead to the gate terminal, and an output impedance matching network electrically coupling the drain terminal to the RF output lead. The output impedance matching network includes first and second LC resonators each being connected in parallel with the source and drain terminals, and a first inductor connected in series between the drain terminal and the RF output lead. The first LC resonator is configured to compensate for an output capacitance of the RF amplifier at a center frequency of the RF signal. The second LC resonator is configured to compensate for a second order harmonic of the RF signal.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates two circuit schematics. FIG. 1A illustrates an electrical schematic of a single resonator turning circuit, according to an embodiment FIG. 1B illustrates an electrical schematic of a dual resonator turning circuit, according to an embodiment.

FIGS. 2A and 2B, illustrates an impedance response comparison of the resonator turning circuits of FIGS. 1A and 1B, according to an embodiment.

FIG. 4 illustrates a packaged amplifier circuit with input and output matching networks, according to an embodiment.

DETAILED DESCRIPTION

An embodiment of circuit topology for an impedance matching network is described herein. This circuit topology can be used for the output impedance matching network and/or the input impedance matching network for a high frequency RF power amplifier device, such as a GaN based transistor. The circuit topology includes a dual resonator configuration. This configuration includes two LC resonators that are electrically in parallel with one another and are connected between the output terminal of the RF power amplifier device and a reference potential (e.g., ground). The first LC resonator is configured to compensate for the input or output capacitance (as the case may be) of the amplifier at the fundamental frequency. The second LC resonator is configured to shunt second order harmonic components of the fundamental frequency. Simulations of the dual resonator approach show that this configuration provides a favorable tradeoff between fundamental frequency and second order harmonic impedance response as well as a greater tolerance for component impedance variation.

Figure 1:
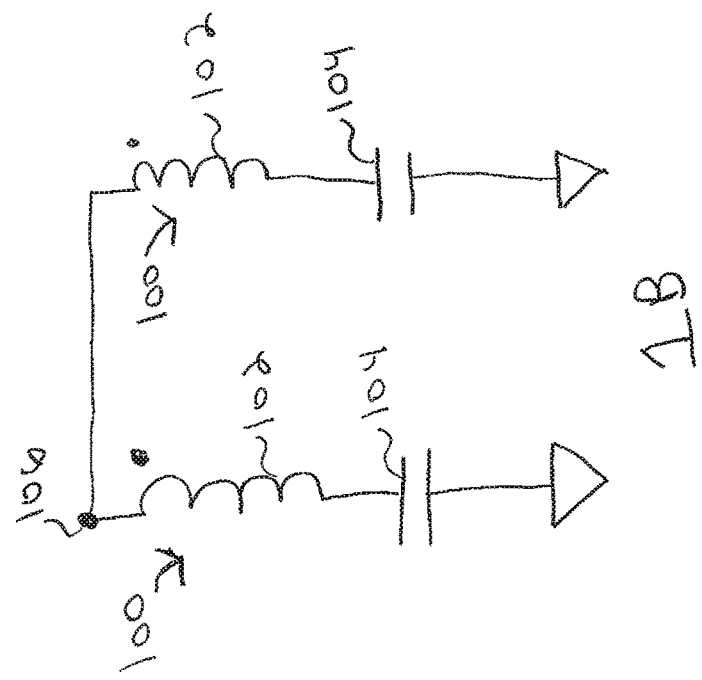
FIG. 1, which includes
Figure 1:
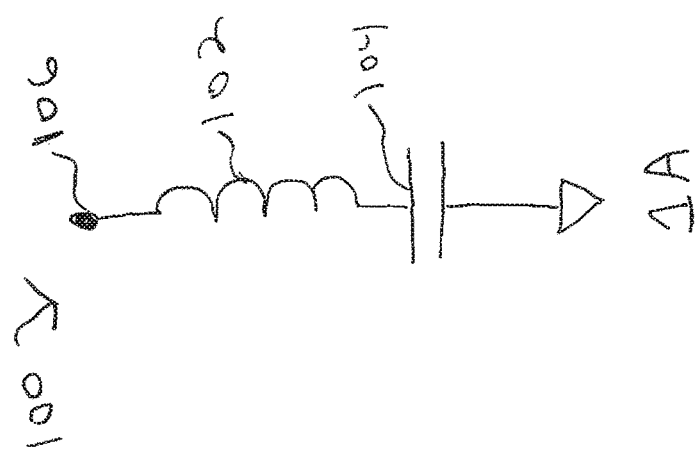

Referring to FIG. 1, two LC circuits are shown. The LC circuit of FIG. 1A includes a resonator 100, which includes an inductor 102 and capacitor 104 connected in series between a first node 106 and ground. The LC circuit of FIG. 1B includes two of the resonators 100 connected in parallel with one another and in series between the first node 106 and ground. As is well known in the art, LC resonators have a resonant frequency at which the inductive and reactive components of the overall impedance cancel out. As a result, the LC resonator appears as an as an electrical short from an RF perspective. In the LC circuit of FIG. 1B, the inductors 102 of each resonator 100 are arranged in a mutually inductive configuration. That is, an electric field generated by one inductor 102 induces a current in the other, and vice-versa.

Figure 2:
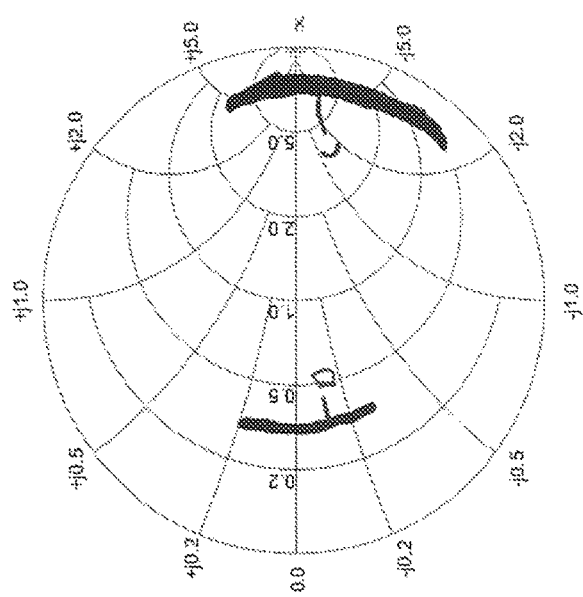
FIG. 2, which includes
Figure 2:
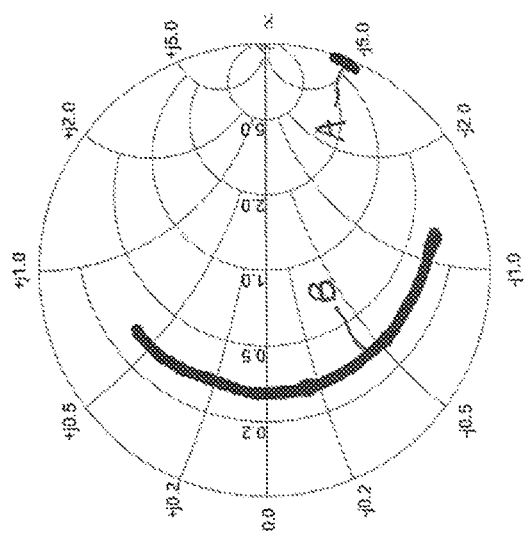

Referring to FIG. 2, a smith chart comparison of the S parameters vs. frequency for the two LC circuits described in FIG. 1 is provided. FIG. 2A depicts an impedance response of the single resonator circuit of FIG. 1A. Curve A shows the impedance of the circuit across a frequency sweep of 1.8 GHz to 2.2 GHz. These frequency values can correspond to a typical fundamental RF frequency range of operation for an amplifier circuit. Curve B shows the impedance of the circuit across a frequency sweep of 3.6 GHz to 4.4 GHz. These frequency values can correspond to second order harmonics of the 1.8 GHz to 2.2 GHz range. FIG. 2B depicts a corresponding impedance response of the dual resonator circuit of FIG. 1B, wherein curve C corresponds to the 1.8 GHz to 2.2 GHz frequency range and curve D corresponds to the 3.6 GHz to 4.4 GHz frequency range. Both simulations apply Gaussian variance in the parameter values of the components to account for typical manufacturing variation of the components. In the case of FIG. 2A, a nominal inductance of 237.47 pH (picoHenrys) and capacitance of 6.00 pF (picoFarads) with a variation of +/−4% inductance and +/−5% capacitance for each component is modeled. In the case of FIG. 2B, a nominal inductance 253.3 pH and capacitance of 30.00 pF with a variation of +/−4% inductance and +/−5% capacitance for each component is modeled.

As can be seen, the dual resonator configuration substantially tightens the impedance response of the circuit in the second order frequency range. That is, the impedance presented by the dual resonator remains much closer to the real axis across the second order frequency sweep in comparison to the single resonator. As a result, the dual resonator provides better harmonic termination and thus higher efficiency across a wideband frequency range in comparison to the single resonator. Moreover, the dual resonator can absorb greater component variations in inductance and capacitance in comparison to the single resonator approach.

One drawback of the dual resonator configuration is a greater variation in impedance response at the fundamental frequency, as evidenced by a comparison of curves A and C. As can be seen, the single resonator approach shows a tighter impedance response than the dual resonator approach. Thus, there is a tradeoff between fundamental frequency performance and second order frequency performance. However, this tradeoff is preferred in many applications. For example, in the case of a packaged amplifier circuit, second order harmonic effects can be very difficult or impossible to tune out at the board level. By contrast, fundamental frequency impedance mismatch can easily be compensated for at the board level. Thus, the dual resonator approach is highly advantageous in the context of a package level impedance matching circuit, as it mitigates impedance mismatch issues that are not correctable outside of the package level.

Figure 3:
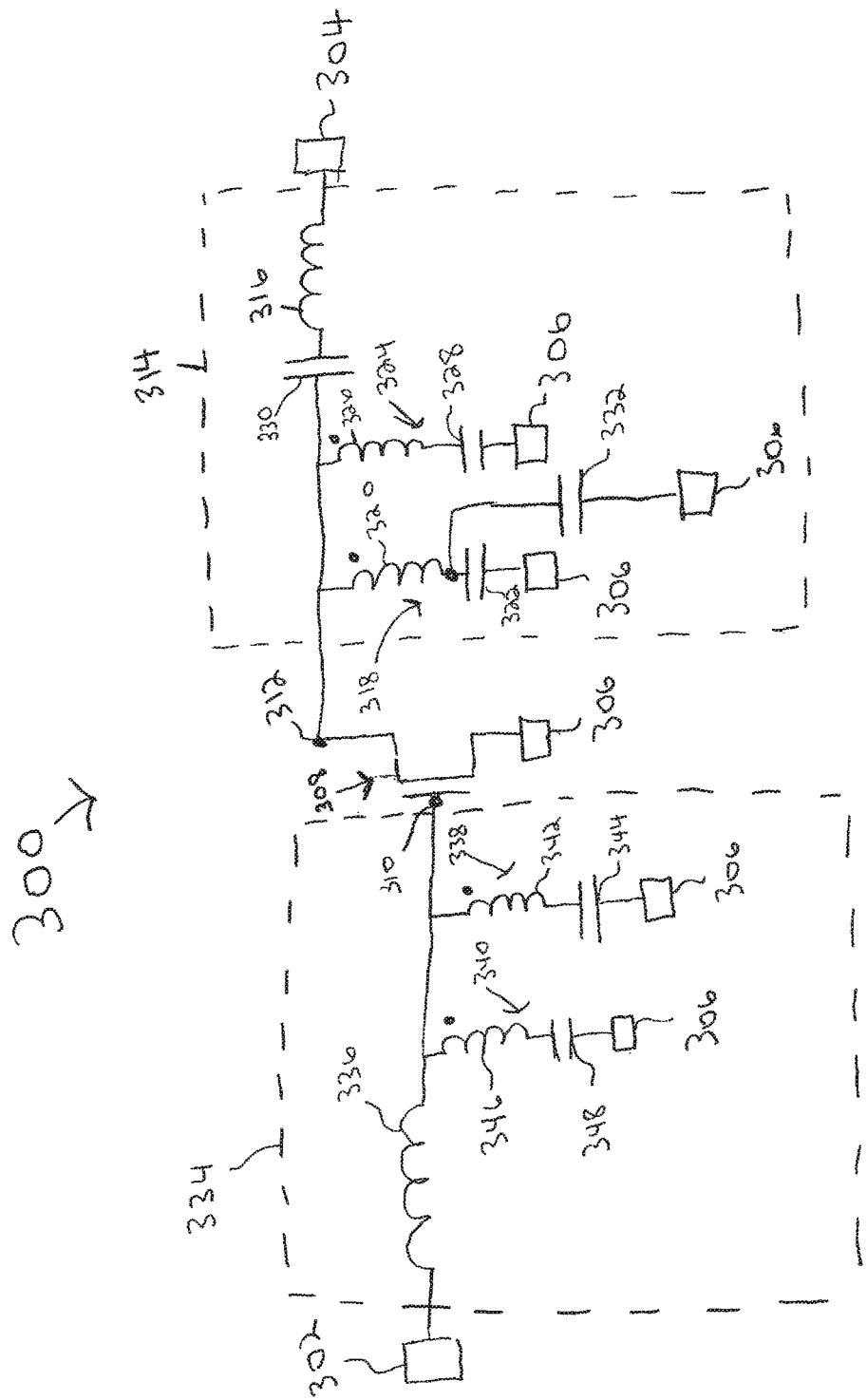
FIG. 3 illustrates an electrical schematic of an amplifier circuit that includes a dual resonator input matching network and a dual resonator output matching network, according to an embodiment.

Referring to FIG. 3, an amplifier circuit 300 that utilizes dual resonator circuit topology described above is depicted. The amplifier circuit 300 includes an RF input port 302 that receives an RF signal, an RF output port 304 that provides an amplified version of the RF signal, and a reference potential port 306 that is set to a reference potential. The reference potential can be any fixed potential, such as a ground potential.

The amplifier circuit 300 further includes an RF amplifier 308. The RF amplifier 308 is configured to amplify an RF signal across an RF frequency range. According to an embodiment, the RF frequency range is between 1.8 GHz and 2.2 GHz with a center frequency of 2.0 GHz. The RF amplifier 308 includes an input terminal 310 that receives the RF signal and an output terminal 312 that provides the amplified version of the RF signal. In various embodiments, the RF amplifier 308 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc., and more generally any type of RF transistor device. The RF amplifier 308 and the complete amplifier circuit 300 can be a multi-carrier amplifier, a multiband amplifier, an LTE (long term evolution) compliant amplifier, a WCDMA (wideband code division multiple access) compliant amplifier, an 802.11(x) compliant amplifier, etc.

The RF amplifier 308 is configured to operate in a wideband frequency range. In contrast to narrowband, wideband refers to the fact that the range of frequency values for the RF signal exceed the coherence bandwidth of a single channel. The wideband frequency range can span at least 10% of a center frequency (e.g., 1.8 GHz to 2.2 GHz, wherein the center frequency is 2.0 GHz) and can span 20% of a center frequency or more. These values represent just one example, and the wideband frequency range is scalable other frequencies.

The amplifier includes an output impedance matching network 314 electrically coupling the first output terminal 312 to the RF output port 304.

The output impedance matching network 314 includes a first inductor 316 electrically connected in series between the first output terminal 312 and the RF output port 304.

The output impedance matching network 314 additionally includes a first LC resonator 318 directly electrically connected between the first output terminal 312 and the reference potential port 306. According to an embodiment, the first LC resonator 318 includes a second inductor 320 and a first capacitor 322. The second inductor 320 can be directly electrically connected to the first output terminal 312 and the first capacitor 322. The first capacitor 322 can be directly electrically connected to the second inductor 320 and the reference potential port 306.

The output impedance matching network 314 additionally includes a second LC resonator 324 directly electrically connected between the first output terminal 312 and the reference potential port 306. The second LC resonator 324 electrically in parallel with the first LC resonator 318. According to an embodiment, the second LC resonator 324 includes a third inductor 326 and a second capacitor 328. The third inductor 326 can be directly electrically connected to the first output terminal 312 and the second capacitor 328. The second capacitor 328 can be directly electrically connected to the third inductor 326 and the reference potential port 306.

The parameters of the first LC resonator 318 (i.e., inductance and capacitance) are selected to compensate for other impedances in the output impedance matching network 314 at the fundamental frequency. More particularly, if the RF amplifier 308 is a MOSFET device, this device has an inherent drain-source capacitance that introduces an impedance on the output side of the amplifier circuit 300. An inductance value of the second inductor 320 can be selected such that the second inductor 320 resonates with both the transistor drain-source capacitance, and the effective capacitance of the second LC resonator 324, at the fundamental (center) frequency. In that case, the first LC resonator 318 completely negates (from a reactance perspective) the output capacitance of the RF amplifier 308 and the effective capacitance of the second LC resonator 324 at the center frequency. In addition, a capacitance value of the first capacitor 322 can be selected to resonate with the other inductive components of output impedance matching network 314, which include the first inductor 316 and the mutually inductive component of the third inductor 326.

The parameters of the second LC resonator 324 (i.e., inductance and capacitance) are selected to compensate for a second order harmonic of the RF signal. For example, the second LC resonator 324 can be configured to present a short circuit (from an RF perspective) at the second order harmonic of the RF signal. That is, the second LC resonator 324 can be tuned to resonate at a frequency that is twice the fundamental operating frequency.

Mutual inductance between the second and third inductors 320, 326 can be factored into the parameter values. In the case of a package level impedance matching circuit that utilizes inductive bond wires, mutual inductance is often difficult or impossible to avoid, due to the proximity of the bond wires. The mutual inductance effect of the third inductor 326 on the first LC resonator 318 can be compensated for by adjusting the inductance of the first inductor 320 to present the desired compensation effect that the fundamental frequency.

Correspondingly, the mutual inductance effect of the second inductor 320 on the second LC resonator 324 can be compensated for by adjusting the inductance of the second inductor 324. Typically, mutual inductance is an undesirable parasitic phenomenon. However, due to the parallel configuration of the first and second LC resonators 318, 324, the mutually inductive arrangement advantageously mitigates deviation from nominal inductance values because the higher inductance appears at the series node, which is compensated for by the capacitance in the resonators.

An inductance value of the first inductor 316 is selected such that the first inductor 316 appears as a high impedance to a third order harmonic of the fundamental frequency (e.g., 6 GHz in the case of a 2.0 GHz fundamental frequency). According to an embodiment, the first inductor 316 is directly electrically connected to the first output terminal 312 and the RF output port 304. Optionally, as shown in FIG. 3, a fourth capacitor 330 can be electrically connected in series between the first inductor 316 and the RF output port 304. Including the fourth capacitor 330 in the circuit provides DC blocking and allows the RF amplifier 308 at an independent DC bias point. The capacitance value of the fourth capacitor 330 can be selected to collectively form a resonant circuit in conjunction with the first inductor 316 that appears as a short circuit (from an RF perspective) at the fundamental frequency. In addition, the capacitance value of the fourth capacitor 330 can be selected to, in conjunction with the first inductor 316, present a higher impedance at the third order harmonic of the fundamental frequency.

As another option, a third capacitor 332 can be electrically connected between the node that connects the first capacitor 322 to the second inductor 320 and the reference potential port 306. The third capacitor 332 can be configured as a so-called DC shunt capacitor. In that case, a capacitance of the third capacitor 332 is selected to provide a short-circuit path for low frequency signals (e.g., signals below 100 MHz in the case of a 1.8 GHZ-2.2 GHz operating range) and DC signals. This modification provides the benefit of efficient linear amplification at low frequency operation of the amplifier.

Optionally, the amplifier includes an input impedance matching network 334 electrically coupling the RF input port 302 to the input terminal 310. The input impedance matching network 334 can have a corresponding circuit topology as the output impedance network. For example the input impedance matching network 334 can include a fourth inductor 336 electrically connected in series between the RF input port 302 and the first input terminal 310, a third LC resonator 338 directly electrically connected between the first input terminal 310 and the reference potential port 306, a fourth LC resonator 340 directly electrically connected between the first input terminal 310 and the reference potential port 306 and being in parallel with the third LC resonator 338. The third LC resonator 338 includes a fifth inductor 342 and a fifth capacitor 344, wherein the fifth inductor 342 is directly electrically connected to the first input terminal 310 and the fifth capacitor 344 is directly electrically connected to the fifth inductor 342 and the reference potential port 306. Likewise, the fourth LC resonator 340 includes a sixth inductor 346 and a sixth capacitor 348, wherein the sixth inductor 346 is directly electrically connected to the first input terminal 310 and the sixth capacitor 348 and the sixth capacitor 348 is directly electrically connected to the sixth inductor 346 and the reference potential port 306.

The parameter values of the input impedance matching network 334 can be tailored in a corresponding manner as the above described tailoring of the output impedance matching network 314. In that case, instead of the output capacitance of the RF amplifier 308, the input capacitance of the RF amplifier 308 is considered. For example, the third LC resonator 338 can be configured to compensate for an input capacitance of the RF amplifier 308 at the center frequency. This can be done by selecting an inductance value of the fifth inductor 342 that resonates with the input capacitance at the center frequency. Likewise, the fourth LC resonator 340 can be configured present a short circuit at the second order harmonic, and the fourth inductor 336 can be configured to present a high impedance at a third order harmonic of the center frequency in the manner previously described. Finally, these values can be refined to account for the interaction of the various components with one another in the manner previously described.

Referring to FIG. 4, a packaged amplifier circuit 400 is depicted, according to an embodiment. The packaged amplifier circuit 400 is configured to interface with an external circuit, such as a printed circuit board. The package includes an electrically conductive RF input lead 402, an electrically conductive RF output lead 406, and an electrically conductive reference potential lead (not shown). The package further includes a substrate 408 with a planar surface that is adapted for the mounting of a number of integrated circuit components thereon. According to an embodiment, the planar surface includes an electrically conductive source pad 410 that is connected to the reference potential lead.

An RF transistor is mounted on the substrate 408. The RF transistor 412 is configured to amplify an RF signal across an RF frequency range, e.g., between 1.8 GHz and 2.2 GHz. The RF transistor 412 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc., and more generally any type of RF transistor device. According to an embodiment, the RF transistor 412 is a GaN based HEMT device.

The RF transistor 412 includes electrically conductive gate, source and drain terminals. In the depicted embodiment, the source terminal (not shown) is disposed on a bottom side of the RF transistor 412. The source terminal directly faces the source pad 410 and is electrically connected to the source pad 410, e.g., by a conductive paste. The gate and drain terminals 414, 416 are disposed on a top side of the RF transistor 412 that is opposite the drain terminals.

The packaged amplifier circuit 400 has the output impedance matching network 314 electrically coupling the drain terminal 416 to the RF output lead 406 and the input impedance matching network 334 electrically coupling the RF input lead 402 to the gate terminal 414. Both the output impedance matching network 314 and the input impedance matching network 334 can have the dual resonator circuit topology described herein. That is, the complete amplifier circuit 300 as described with reference to FIG. 3 can be integrated into the device package.

In the embodiment of FIG. 4, the capacitors of the input impedance matching network 334 and the output impedance matching network 314 are provided by chip capacitors that are mounted directly on the source pad 410. These chip capacitors can be configured with electrically conductive terminals on opposite facing sides. A lower terminal of the chip capacitors directly faces and electrically connects to the source pad 410. The second terminals of the chip capacitors are disposed on the top side of the chip capacitors and are accessible for electrical connection, e.g., by bond wire.

In the depicted example, the first capacitor 322 is provided by a first chip capacitor 418, the second capacitor 328 is provided by a second chip capacitor 420, the fifth capacitor 344 is provided by a third chip capacitor 422, and the sixth capacitor 348 is provided by a fourth chip capacitor 424. Instead of using discrete chip capacitors for each capacitor in the matching circuits, two or more of the capacitors can be integrated in a single capacitor. For example, the first and second capacitors 418, 420 could be provided in a single chip capacitor with segmented capacitors.

The inductors of the impedance matching networks are provided by electrically conductive bond wires that are connected between the appropriate nodes. As those of ordinary skill will appreciate, there is a certain inductance associated with any wire connection. Thus, each span of bond wires extending between two conductive terminals provides a defined inductance. This inductance value can be adjusted by tailoring the physical parameters of the spans of the bond wires. Exemplary physical parameters that can be tailored to achieve a desired inductance include height of the bond wires, separation distance between the bond wires, length of the spans of the bond wires, to name a few.

In the depicted example, the first inductor 316 is provided by a first set of bond wires 426 that are directly electrically connected to the drain terminal 416 of the RF transistor 412 and the RF output lead 406, the second inductor 320 of the first LC resonator 318 is provided by a second set of bond wires 428 that are directly electrically connected to the drain terminal 416 of the RF transistor 412 and the first chip capacitor 418, and the third inductor 326 of the second LC resonator 324 is provided by a third set of bond wires 430 that are directly electrically connected to the drain terminal 416 of the RF transistor 412 and the second chip capacitor 420. According to an embodiment, the second and third sets of bond wires 426, 430 are interdigitated with one another. That is, the bond wires of each set run parallel to one another and alternate back and forth. As a result, a mutual inductance arises between the two sets of bond wires. On the input side, the fourth inductor 336 is provided by a fourth set of bond wires 432 that are directly electrically connected to the gate terminal 414 and the RF input lead 402, the fifth inductor 342 of the third LC resonator 338 is provided by a fifth set of bond wires 434 that are directly electrically connected to the gate terminal 414 and the third chip capacitor 422 and the sixth inductor 346 of the fourth LC resonator 340 is provided by a sixth set of bond wires 436 that are directly electrically connected to the gate terminal 414 and the fourth chip capacitor 424.

The third and fourth capacitors 322, 330 can be provided by separate capacitors (not shown) or can alternatively be incorporated into the first or second chip capacitors 418, 420.

The term "electrically connected" describes a permanent low-ohmic connection between electrically connected elements, for example a wire connection between the concerned elements. An electrical connection is nominally a zero impedance connection. By contrast, the term "electrically coupled" contemplates a connection in which there is not necessarily nominally zero impedance connection between coupled elements. For instance, active elements, such as transistors, as well as passive elements, such as inductors, capacitors, diodes, resistors, etc., may electrically couple two elements together.

The term "directly electrically connected," "direct electrical contact," and the like describes a connection in which the two elements are physically joined together without any intervening elements adapted for signal transmission disposed between the elements. For example, a bonding wire is directly connected to a bonding pad when the bonding wire is physically adhered to the bonding pad, e.g., by a conductive bonding paste. By contrast, a bonding wire that is electrically connected to a passive or active circuit element, which in turn is electrically connected to a bonding pad, is not "directly electrically connected" to the bonding pad within the meaning of the present specification.

As used herein, compensation occurs when the reactive impedance of a compensating element at least partially negates the reactive impedance of the compensated element. In the case of an LC resonator circuit that includes capacitance and inductance the reactive components of each element completely negate one another at the resonant frequency. In this case, the LC resonator circuit appears as an electrical short from an RF perspective. Partial compensation occurs when at least some reactive impedance remains, but less reactance than would otherwise be present in the absence of the compensating element.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier circuit, comprising:
an RF input port;
an RF output port;
a reference potential port;
an RF amplifier having an input terminal and a first output terminal, the RF amplifier being configured to amplify an RF signal across an RF frequency range;
an output impedance matching network electrically coupling the first output terminal to the RF output port, wherein the output impedance matching network comprises:
a first inductor electrically connected in series between the first output terminal and the RF output port;
a first LC resonator directly electrically connected between the first output terminal and the reference potential port;
a second LC resonator directly electrically connected between the first output terminal and the reference potential port and being in parallel with the first LC resonator;
wherein the first LC resonator is configured to compensate for an output capacitance of the RF amplifier at a center frequency of the RF signal, and
wherein the second LC resonator is configured to compensate for a second order harmonic of the RF signal.

2. The amplifier circuit of claim 1, wherein the first LC resonator is configured to negate an output capacitance of the RF amplifier at the center frequency, and wherein the second LC resonator is configured to present a short circuit at the second order harmonic of the RF signal.

3. The amplifier circuit of claim 2, wherein the first inductor is configured to present a high impedance at a third order harmonic of the center frequency.

4. The amplifier circuit of claim 3, wherein the first LC resonator comprises a second inductor and a first capacitor, wherein the second LC resonator comprises a third inductor and a second capacitor, wherein the second inductor is directly electrically connected to the first output terminal and the first capacitor, wherein the first capacitor is directly electrically connected to the second inductor and the reference potential port, wherein the third inductor is directly electrically connected to the first output terminal and the second capacitor, wherein the second capacitor is directly electrically connected to the third inductor and the reference potential port, and wherein the first inductor is directly electrically connected to the first output terminal.

5. The amplifier circuit of claim 4, wherein the second and third inductors are arranged in a mutually inductive configuration.

6. The amplifier circuit of claim 4, further comprising:
a third capacitor electrically connected between a node that connects the first capacitor to the second inductor and the reference potential port,
wherein the third capacitor is configured to present a short circuit at very low frequency values that are below the RF frequency range.

7. The amplifier circuit of claim 4, further comprising:
a fourth capacitor electrically connected in series between the first inductor and the RF output port,
wherein the fourth capacitor and the third inductor are collectively configured to present a short circuit at the center frequency.

8. The amplifier circuit of claim 1, further comprising:
an input impedance matching network electrically coupling the RF input port to the input terminal, wherein the input impedance matching network comprises:
a fourth inductor electrically connected in series between the RF input port and the first input terminal;

a third LC resonator directly electrically connected between the first input terminal and the reference potential port;
a fourth LC resonator directly electrically connected between the first input terminal and the reference potential port and being in parallel with the third LC resonator
wherein the third LC resonator is configured to compensate for an input capacitance of the RF amplifier at the center frequency, and
wherein the fourth LC resonator is configured to compensate for a second order harmonic of the RF signal.

9. The amplifier circuit of claim 8, wherein the third LC resonator is configured to negate an input capacitance of the RF amplifier at the center frequency, wherein the fourth LC resonator is configured to present a short circuit at the second order harmonic, and wherein the fourth inductor is configured to present a high impedance at a third order harmonic of the center frequency.

10. An amplifier circuit, comprising:
an RF input port;
an RF output port;
a reference potential port;
an RF amplifier having an input terminal and a first output terminal, the RF amplifier being configured to amplify an RF signal across an RF frequency range;
an input impedance matching network electrically coupling the RF input port to the input terminal, wherein the input impedance matching network comprises:
a fourth inductor electrically connected in series between the RF input port and the first input terminal;
a third LC resonator directly electrically connected between the first input terminal and the reference potential port;
a fourth LC resonator directly electrically connected between the first input terminal and the reference potential port and being in parallel with the third LC resonator
wherein the third LC resonator is configured to compensate for an input capacitance of the RF amplifier at a center frequency of the RF signal, and
wherein the fourth LC resonator is configured to compensate for a second order harmonic of the RF signal.

11. The amplifier circuit of claim 10, wherein the third LC resonator is configured to negate an input capacitance of the RF amplifier at the center frequency, wherein the fourth LC resonator is configured to present a short circuit at the second order harmonic, and wherein the fourth inductor is configured to present a high impedance at a third order harmonic of the center frequency.

12. A packaged amplifier circuit, comprising:
an RF input lead;
an RF output lead;
a substrate with an electrically conductive source pad, the source pad being connected to a reference potential lead;
an RF transistor having gate, source and drain terminals, the RF transistor being configured to amplify an RF signal across an RF frequency range, the RF transistor being mounted on the substrate with the source terminal directly facing and electrically connected to the source pad;
an input impedance matching network electrically coupling the RF input lead to the gate terminal;
an output impedance matching network electrically coupling the drain terminal to the RF output lead;
wherein the output impedance matching network comprises:
first and second LC resonators each being connected in parallel with the source and drain terminals; and
a first inductor connected in series between the drain terminal and the RF output lead,
wherein the first LC resonator is configured to compensate for an output capacitance of the RF amplifier at a center frequency of the RF signal, and
wherein the second LC resonator is configured to compensate for a second order harmonic of the RF signal.

13. The amplifier circuit of claim 12, wherein the first LC resonator is configured to negate a drain-source capacitance of the RF transistor at the center frequency, and wherein the second LC resonator is configured to present a short circuit the second order harmonic.

14. The amplifier circuit of claim 13, wherein the first inductor is configured to present a high impedance at a third order harmonic of the center frequency.

15. The amplifier circuit of claim 14, wherein the first LC resonator comprises a second inductor and a first capacitor, wherein the second LC resonator comprises a third inductor and a second capacitor, wherein the second inductor is directly electrically connected to the first output terminal and the first capacitor, wherein the first capacitor is directly electrically connected to the second inductor and the source pad, wherein the third inductor is directly electrically connected to the first output terminal and the second capacitor, wherein the second capacitor is directly electrically connected to the third inductor and the source pad, and wherein the first inductor is directly electrically connected to the first output terminal.

16. The amplifier circuit of claim 15, wherein the first, second and third inductors are each formed by one or more electrically conductive bond wires, wherein the first and second capacitors are provided, respectively, by first and second chip capacitors, the first chip capacitor being mounted on the substrate with a lower terminal directly facing and electrically connected to the source pad and an upper terminal electrically connected to the bond wires of the second inductor, the second chip capacitor being mounted on the substrate with a first terminal directly facing and electrically connected to the source pad and an upper terminal electrically connected to the bond wires of the third inductor.

17. The amplifier circuit of claim 16, wherein the bond wires of the second and third inductors are interdigitated with one another to provide a mutually inductive relationship between the second and third inductors.

18. The amplifier circuit of claim 16, further comprising:
a third capacitor mounted on the substrate with a lower terminal facing and directly connected to the source pad and an upper terminal directly electrically connected to a node connecting the second inductor to the first capacitor,
wherein the third capacitor is configured to present a short circuit at very low frequency values that are below the RF frequency range.

19. The amplifier circuit of claim 16, further comprising:
a fourth capacitor mounted on the substrate and connected in series between the first inductor and the RF output port,
wherein the fourth capacitor and the third inductor are collectively configured to present a short circuit at the center frequency.

20. The amplifier circuit of claim 12, further comprising:
an input impedance matching network electrically coupling the RF input port to the input terminal, wherein the input impedance matching network comprises:
- a fourth inductor electrically connected in series between the RF input port and the first input terminal;
- a third LC resonator directly electrically connected between the first input terminal and the reference potential port;
- a fourth LC resonator directly electrically connected between the first input terminal and the reference potential port and being in parallel with the third LC resonator wherein the third LC resonator is configured to compensate for an input capacitance of the RF amplifier, and wherein the fourth LC resonator is configured to compensate for a second order harmonic of the RF signal.

* * * * *